United States Patent
Kimura et al.

(10) Patent No.: US 8,461,606 B2
(45) Date of Patent: Jun. 11, 2013

(54) SEMICONDUCTOR LIGHT-EMITTING DEVICE AND METHOD FOR MANUFACTURING SAME

(75) Inventors: Shigeya Kimura, Kanagawa-ken (JP); Hajime Nago, Kanagawa-ken (JP); Toshiyuki Oka, Kanagawa-ken (JP); Koichi Tachibana, Kanagawa-ken (JP); Toshiki Hikosaka, Tokyo (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 278 days.

(21) Appl. No.: 12/875,822

(22) Filed: Sep. 3, 2010

(65) Prior Publication Data

US 2011/0215351 A1 Sep. 8, 2011

(30) Foreign Application Priority Data

Mar. 8, 2010 (JP) .................. 2010-050391

(51) Int. Cl.
*H01L 33/00* (2010.01)
(52) U.S. Cl.
USPC ............... 257/94; 257/103; 257/E33.008
(58) Field of Classification Search
USPC .......................................... 257/103
See application file for complete search history.

(56) References Cited

U.S. PATENT DOCUMENTS

| | | | |
|---|---|---|---|
| 7,872,269 B2 * | 1/2011 | Nakahara | 257/94 |
| 2001/0002048 A1 | 5/2001 | Koike et al. | |
| 2005/0214992 A1 * | 9/2005 | Chakraborty et al. | 438/172 |
| 2009/0146160 A1 | 6/2009 | Nakahara | |
| 2010/0040102 A1 | 2/2010 | Ahn | |

FOREIGN PATENT DOCUMENTS

| | | |
|---|---|---|
| CN | 101006590 A | 7/2007 |
| JP | 2890390 | 2/1999 |
| JP | 2000-232236 | 8/2000 |
| JP | 2002-16284 | 1/2002 |
| JP | 3424629 | 5/2003 |
| JP | 2004-87762 | 3/2004 |
| JP | 2007-227671 | 9/2007 |
| JP | 2008-508720 A | 3/2008 |
| JP | 2008-244360 | 10/2008 |
| KR | 10-2004-0029165 | 4/2004 |

OTHER PUBLICATIONS

Office Action issued Oct. 17, 2011, in Japanese Patent Application No. 2010-050391 with English translation.

(Continued)

*Primary Examiner* — Benjamin Sandvik
(74) *Attorney, Agent, or Firm* — Oblon, Spivak, McClelland, Maier & Neustadt, L.L.P.

(57) ABSTRACT

According to one embodiment, a semiconductor light-emitting device includes an n-type semiconductor layer including a nitride semiconductor, a p-type semiconductor layer including a nitride semiconductor, a light-emitting portion and a stacked body. The light-emitting portion is provided between the n-type and p-type semiconductor layers and includes a barrier layer and a well layer. The well layer is stacked with the barrier layer. The stacked body is provided between the light-emitting portion and the n-type semiconductor layer and includes a first layer and a second layer. The second layer is stacked with the first layer. Average In composition ratio of the stacked body is higher than 0.4 times average In composition ratio of the light-emitting portion. The layer thickness $t_b$ of the barrier layer is 10 nanometers or less.

14 Claims, 5 Drawing Sheets

OTHER PUBLICATIONS

Niu Nanhui, et al., "Enhanced Luminescence of InGaN/GaN multiple quantum Wells by strain reduction", Solid-State Electronics, vol. 51, 2007, pp. 860-864.
Extended Search Report issued Mar. 16, 2012 in European Patent Application No. 10251558.2.
U.S. Appl. No. 13/030,440, filed Feb. 18, 2011, Tachibana, et al.
U.S. Appl. No. 12/873,662, filed Sep. 1, 2010, Hajime Nago et al.
Korean Office Action issued Jan. 20, 2012 in patent application No. 10-2010-0087452 with English translation.
Japanese Office Action issued on Jan. 22, 2013 in counterpart Japanese Patent Application No. 2011-276364 (with English translation).
Chinese Office Action issued Jan. 16, 2013 in counterpart Chinese patent application No. 201010275579.4 (with English translation).

* cited by examiner

US 8,461,606 B2

SEMICONDUCTOR LIGHT-EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-050391, filed on Mar. 8, 2010; the entire contents of which are incorporated herein by reference.

FIELD

Embodiments described herein relate generally to a semiconductor light-emitting device and a method for manufacturing the same.

BACKGROUND

Group III-V nitride compound semiconductors such as gallium nitride (GaN) have wide bandgap. Exploiting this feature, they are applied to light-emitting diodes (LED) emitting ultraviolet to blue/green light with high brightness, and laser diodes (LD) emitting blue-violet to blue light.

These light-emitting devices have the following structure. On a sapphire substrate, for instance, an n-type semiconductor layer, a light-emitting layer including a quantum well layer and a barrier layer, and a p-type semiconductor layer are stacked in this order.

In such semiconductor light-emitting devices, there is demand for simultaneously achieving low driving voltage and high light emission efficiency.

By thinning the barrier layer, the driving voltage tends to decrease. However, thinning the barrier layer results in degraded crystallinity, which decreases the light emission efficiency. On the other hand, the quantum well layer is made of e.g. InGaN. Here, nonuniform composition ratio of In and difference in lattice constant cause lattice strain in the quantum well layer. As a result, defects are generated in the crystal. Furthermore, the piezoelectric field induced by the strain modulates the band structure of the active layer and decreases the light emission efficiency.

With a view to increasing the light emission output power, decreasing the forward voltage, and improving the electrostatic breakdown voltage, a nitride semiconductor device is described in JP-3424629. This nitride semiconductor device includes an active layer between an n-type nitride semiconductor layer and a p-type nitride semiconductor layer. The n-type nitride semiconductor layer includes an n-type contact layer and an n-type multi-film layer with a superlattice structure. Furthermore, an undoped GaN layer having a film thickness of 100 angstroms or more is interposed between the n-type contact layer and the n-type multi-film layer. However, despite such conventional techniques, there is room for improvement to achieve low driving voltage and high light emission efficiency.

DETAILED DESCRIPTION

Figure 1:
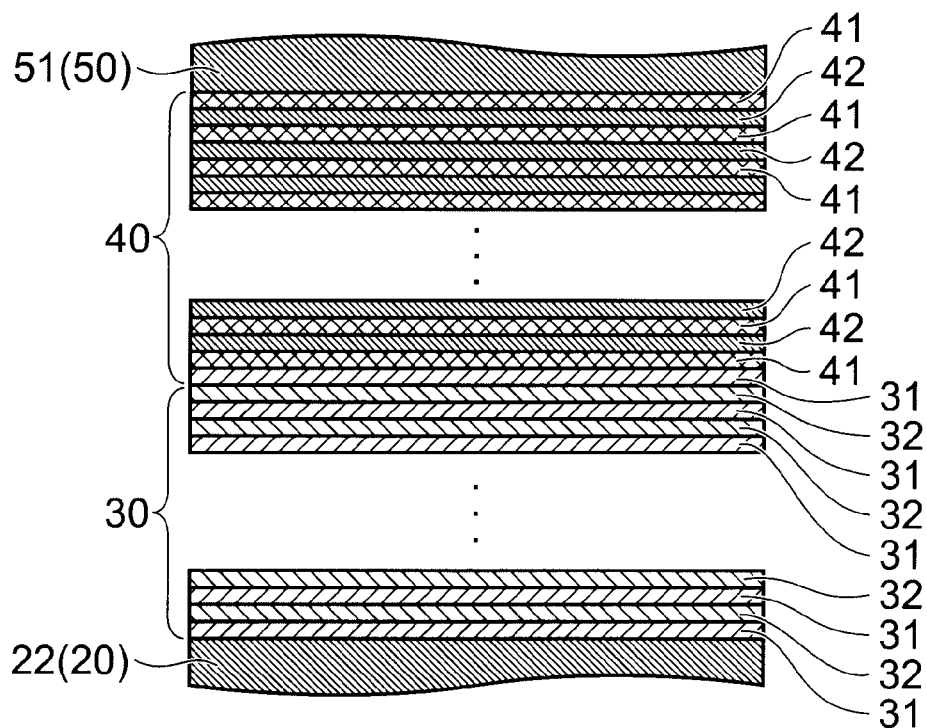
FIG. 1 is a schematic cross-sectional view illustrating the configuration of part of a semiconductor light-emitting device.

In general, according to one embodiment, a semiconductor light-emitting device includes an n-type semiconductor layer including a nitride semiconductor, a p-type semiconductor layer including a nitride semiconductor, a light-emitting portion and a stacked body. The light-emitting portion is provided between the n-type semiconductor layer and the p-type semiconductor layer and includes a barrier layer and a well layer. The barrier layer includes $In_bGa_{1-b}N$ ($0 \leq b < 1$) and has a layer thickness $t_b$ (nanometers). The well layer is stacked with the barrier layer, includes $In_wGa_{1-w}N$ ($0 < w < 1$, $b < w$), and has a layer thickness $t_w$ (nanometers). The stacked body is provided between the light-emitting portion and the n-type semiconductor layer and includes a first layer and a second layer. The first layer includes $In_xGa_{1-x}N$ ($0 \leq x < 1$) and has a layer thickness $t_x$ (nanometers). The second layer is stacked with the first layer, includes $In_yGa_{1-y}N$ ($0 < y < 1$, $x < y < w$), and has a layer thickness $t_y$ (nanometers). Average In composition ratio of the stacked body is higher than 0.4 times average In composition ratio of the light-emitting portion, assuming that the average In composition ratio of the light-emitting portion is $(w \times t_w + b \times t_b)/(t_w + t_b)$, and the average In composition ratio of the stacked body is $(x \times t_x + y \times t_y)/(t_x + t_y)$. The layer thickness $t_b$ of the barrier layer is 10 nanometers or less.

According to another embodiment, a semiconductor light-emitting device includes a substrate, an n-type semiconductor layer, a stacked body, a light-emitting portion and a p-type semiconductor layer. The n-type semiconductor layer is provided on the substrate and includes a nitride semiconductor. The stacked body is provided on the n-type semiconductor layer and includes a first layer and a second layer. The light-emitting portion is provided on the stacked body and includes a barrier layer and a well layer. The p-type semiconductor layer is provided on the light-emitting portion and includes a nitride semiconductor. The barrier layer includes $In_bGa_{1-b}N$ ($0 \leq b < 1$) and has a layer thickness $t_b$ (nanometers). The well layer is stacked with the barrier layer, includes $In_wGa_{1-w}N$ ($0 < w < 1$, $b < w$), and has a layer thickness $t_w$ (nanometers). The first layer includes $In_xGa_{1-x}N$ ($0 \leq x < 1$) and has a layer thickness $t_x$ (nanometers). The second layer is stacked with the first layer, includes $In_yGa_{1-y}N$ ($0 < y < 1$, $x < y < w$), and has a layer thickness $t_y$ (nanometers). Average In composition ratio of the stacked body is higher than 0.4 times average In composition ratio of the light-emitting portion, assuming that the average In composition ratio of the light-emitting portion is $(w \times t_w + b \times t_b)/(t_w + t_b)$, and the average In composition ratio of the stacked body is $(x \times t_x + y \times t_y)/(t_x + t_y)$. The layer thickness $t_b$ of the barrier layer is 10 nanometers or less.

According to another embodiment, a method for manufacturing a semiconductor light-emitting device is disclosed. The method can include forming an n-type semiconductor layer including a nitride semiconductor on a substrate. The method can include forming a stacked body including a first layer and a second layer on the n-type semiconductor layer. The method can include forming a light-emitting portion including a barrier layer and a well layer on the stacked body. The method can include forming a p-type semiconductor layer on the light-emitting portion. The forming the stacked body includes forming the first layer including $In_xGa_{1-x}N$ ($1 \leq x < 1$) with a thickness of layer thickness $t_x$ nanometers on the n-type semiconductor layer and forming the second layer including $In_yGa_{1-y}N$ ($0 < y < 1$, $x < y$) with a thickness of layer thickness $t_y$ nanometers on the first layer. The forming the light-emitting portion includes forming the barrier layer including $In_bGa_{1-b}N$ ($0 \leq b < 1$, $b < w$) with a layer thickness $t_b$ nanometers having a value of 10 nanometers or less on the stacked body and forming the well layer including $In_wGa_{1-w}N$ ($0 < w < 1$, $y < w$) with a thickness of layer thickness $t_w$ nanometers on the barrier layer. At least one of the forming the stacked body and the forming the light-emitting portion is performed so that average In composition ratio of the stacked body is higher than 0.4 times average In composition ratio of the light-emitting portion, assuming that the average In composition ratio of the stacked body is $(x \times t_x + y \times t_y)/(t_x + t_y)$, and the average In composition ratio of the light-emitting portion is $(w \times t_w + b \times t_b)/(t_w + t_b)$.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same components as those described previously with reference to earlier figures are labeled with like reference numerals, and the detailed description thereof is omitted as appropriate.

First Embodiment

FIG. 1 is a schematic cross-sectional view illustrating the configuration of part of a semiconductor light-emitting device according to a first embodiment.

Figure 2:
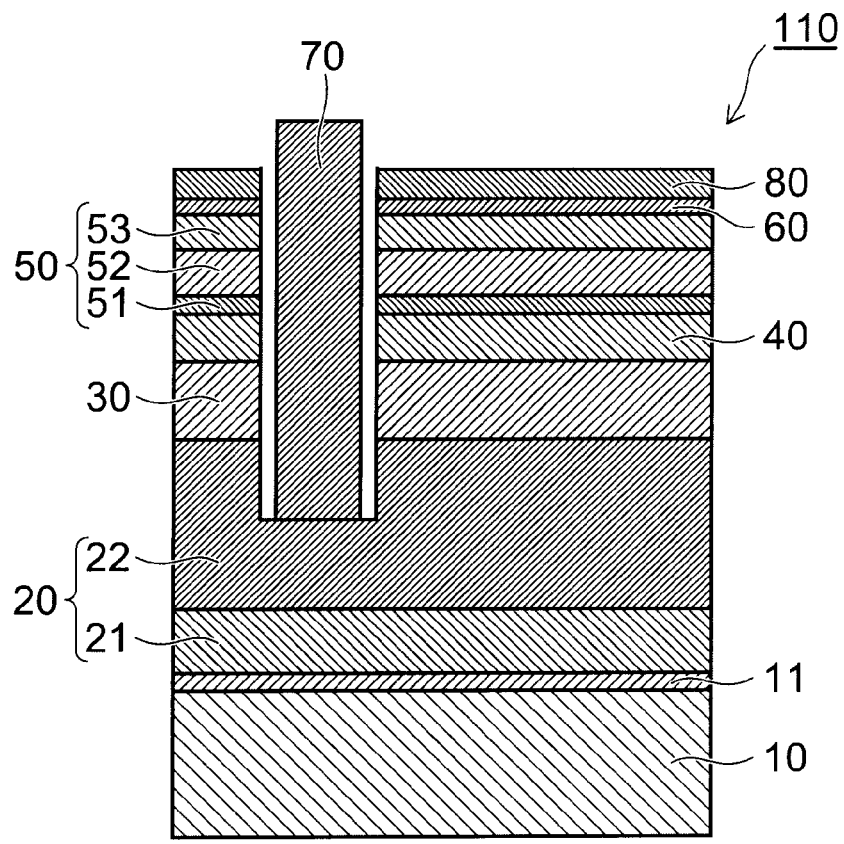
FIG. 2 is a schematic cross-sectional view illustrating the configuration of the semiconductor light-emitting device.

FIG. 2 is a schematic cross-sectional view illustrating the configuration of the semiconductor light-emitting device according to the first embodiment.

As shown in FIG. 2, the semiconductor light-emitting device 110 according to this embodiment includes an n-type semiconductor layer 20, a p-type semiconductor layer 50, a light-emitting portion 40 provided between the n-type semiconductor layer 20 and the p-type semiconductor layer 50, and a stacked body 30 provided between the light-emitting portion 40 and the n-type semiconductor layer 20.

The n-type semiconductor layer 20 and the p-type semiconductor layer 50 include nitride semiconductors.

The light-emitting portion 40 is e.g. an active layer. The stacked body 30 is e.g. a superlattice layer.

In the semiconductor light-emitting device 110, on the major surface (e.g., C-surface) of a substrate 10 made of e.g. sapphire is provided a buffer layer 11, for instance. An undoped GaN foundation layer 21 and an n-type GaN contact layer 22, for instance, are provided on the buffer layer 11. The n-type GaN contact layer 22 is included in the n-type semiconductor layer 20. The GaN foundation layer 21 may be regarded as being included in the n-type semiconductor layer 20 for convenience.

The stacked body 30 is provided on the n-type GaN contact layer 22. In the stacked body 30, for instance, first layers 31 and second layers 32 are alternately stacked. The detailed configuration of the first layer 31 and the second layer 32 is described later.

The light-emitting portion 40 (active layer) is provided on the stacked body 30. The light-emitting portion 40 has e.g. a multiple quantum well (MQW) structure. That is, the light-emitting portion 40 includes a structure in which a plurality of barrier layers 41 and a plurality of well layers 42 are alternately and repetitively stacked. The detailed configuration of the barrier layer 41 and the well layer 42 is described later.

On the light-emitting portion 40, a p-type AlGaN layer 51, a p-type e.g. Mg-doped GaN layer 52, and a p-type GaN contact layer 53 are provided in this order. The p-type AlGaN layer 51 functions as an electron overflow prevention layer. The p-type AlGaN layer 51, the Mg-doped GaN layer 52, and the p-type GaN contact layer 53 are included in the p-type semiconductor layer 50. Furthermore, a transparent electrode 60 is provided on the p-type GaN contact layer 53.

A portion of the n-type GaN contact layer 22 constituting the n-type semiconductor layer 20, and the stacked body 30, the light-emitting portion 40, and the p-type semiconductor layer 50 corresponding to the portion are removed. An n-side electrode 70 is provided on the n-type GaN contact layer 22. The n-side electrode 70 is made of a stacked structure of e.g. Ti/Pt/Au. On the other hand, a p-side electrode 80 is provided on the transparent electrode 60.

Thus, the semiconductor light-emitting device 110 of this example according to this embodiment is a light-emitting diode (LED).

As shown in FIG. 1, the light-emitting portion 40 includes a barrier layer 41 and a well layer 42 stacked with the barrier layer 41. In this example, the barrier layer 41 is provided in a plurality, and the well layer 42 is provided in a plurality. Each well layer 42 is provided between the plurality of barrier layers 41.

The barrier layer 41 and the well layer 42 include nitride semiconductors. The well layer 42 is made of a nitride semiconductor containing In. The barrier layer 41 has a larger bandgap energy than the well layer 42.

The barrier layer 41 includes $In_bGa_{1-b}N$ ($0 \leq b < 1$). The thickness of the barrier layer 41 is a layer thickness $t_b$ (nanometers). On the other hand, the well layer 42 includes $In_wGa_{1-w}N$ ($0 < w < 1$). The thickness of the well layer 42 is a layer thickness $t_w$ (nanometers).

Here, the In composition ratio w of the well layer 42 is higher than the In composition ratio b of the barrier layer 41, i.e., $b < w$. The In composition ratio b of the barrier layer 41 may be zero. For instance, the barrier layer 41 may be made of GaN. On the other hand, the In composition ratio w of the well layer 42 is higher than zero, and the well layer 42 includes InGaN.

In the case where the barrier layer 41 contains In, the In composition ratio b of the barrier layer 41 is lower than the In composition ratio w of the well layer 42. Thus, the well layer 42 has a smaller bandgap energy than the barrier layer 41.

The barrier layer 41 and the well layer 42 may contain a trace amount of Al and the like.

In this example, a plurality of barrier layers 41 and a plurality of well layers 42 are provided. First, for simplicity of description, it is assumed that the plurality of barrier layers 41 have an equal In composition ratio b, and also have an equal thickness. Similarly, it is assumed that the plurality of well layers 42 have an equal In composition ratio w, and also have an equal thickness.

On the other hand, as shown in FIG. 1, the stacked body 30 includes a first layer 31 and a second layer 32. The stacked body 30 has a structure in which the first layer 31 and the second layer 32 are alternately stacked. Here, the stacked body 30 only needs to be a structure in which the first layer 31 and the second layer 32 are stacked in at least one pair.

The first layer 31 includes $In_xGa_{1-x}N$ ($0 \leq x < 1$). The thickness of the first layer 31 is a layer thickness $t_x$ (nanometers). On the other hand, the second layer 32 includes $In_yGa_{1-y}N$ ($0 < y \leq 1$). The thickness of the second layer 32 is a layer thickness $t_y$ (nanometers).

In this example, a plurality of first layers 31 and a plurality of second layers 32 are provided. First, for simplicity of description, it is assumed that the plurality of first layers 31 have an equal In composition ratio x, and also have an equal thickness. Similarly, it is assumed that the plurality of second layers 32 have an equal In composition ratio y, and also have an equal thickness.

Here, the In composition ratio y of the second layer 32 is higher than the In composition ratio x of the first layer 31, i.e., x<y. The In composition ratio x of the first layer 31 may be zero. For instance, the first layer 31 can be made of GaN. On the other hand, the In composition ratio y of the second layer 32 is higher than zero, and the second layer 32 includes InGaN.

Here, the In composition ratio y of the second layer 32 is lower than the In composition ratio w of the well layer 42, i.e., y<w. Hence, the In composition ratio x of the first layer 31 is also lower than the In composition ratio w of the well layer 42, i.e., x<w. This suppresses absorption of light emitted from the light-emitting portion 40 in the first layer 31 and the second layer 32, and increases the light extraction efficiency. That is, the light emission efficiency is increased.

That is, the In composition ratios of the barrier layer 41, the well layer 42, the first layer 31, and the second layer 32 described above satisfy b<w and x<y<w.

Furthermore, the In composition ratio b of the barrier layer 41 and the In composition ratio x of the first layer 31 are arbitrary as long as the "average In composition ratios" described later satisfy the relation described later.

In the semiconductor light-emitting device 110 according to this embodiment, the layer thickness $t_b$ of the barrier layer 41 is as thin as 10 nanometers (nm) or less. As a result, the driving voltage of the semiconductor light-emitting device 110 decreases to the practically required level.

On the other hand, in the semiconductor light-emitting device 110, the stacked body average In composition ratio p of the stacked body 30 is made higher than 0.4 times the light-emitting portion average In composition ratio q of the light-emitting portion 40. This suppresses strain applied to the well layer 42 and improves the crystallinity. Furthermore, this can suppress the effect of piezoelectric field and increase the light emission efficiency. That is, low driving voltage and high light emission efficiency can be simultaneously achieved.

Here, the light-emitting portion average In composition ratio q of the light-emitting portion 40 is defined as follows.

Suppose that the well layer 42 includes $In_wGa_{1-w}N$ and has a layer thickness $t_w$ (nanometers), and the barrier layer 41 includes $In_bGa_{1-b}N$ and has a layer thickness $t_b$ (nanometers). Then, the light-emitting portion average In composition ratio q is defined as $(w \times t_w + b \times t_b)/(t_w + t_b)$.

The stacked body average In composition ratio p of the stacked body 30 is defined as follows.

Suppose that the first layer 31 includes $In_xGa_{1-x}N$ and has a layer thickness $t_x$ nanometers, and the second layer 32 includes $In_yGa_{1-y}N$ and has a layer thickness $t_y$ nanometers. Then, the stacked body average In composition ratio p is defined as $(x \times t_x + y \times t_y)/(t_x + t_y)$.

In the semiconductor light-emitting device 110 including the light-emitting portion 40 and the stacked body 30 as described above, the lattice strain applied to the light-emitting portion 40 is lower than in the case without the light-emitting portion 40 and the stacked body 30 as described above. Thus, the semiconductor light-emitting device 110 achieves high light emission efficiency and low driving voltage.

In general, in the well layer 42 made of InGaN, due to lattice constant difference, lattice strain is likely to occur, and hence crystal defects are likely to occur. Furthermore, the band energy is modulated by the piezoelectric field due to the lattice strain, and the light emission efficiency is likely to decrease. In the case where the thickness of the barrier layer 41 is thinned to decrease the driving voltage, the crystallinity is likely to be degraded. Simultaneously, the aforementioned strain applied to the well layer 42 increases. This further interferes with the increase of light emission efficiency.

In contrast, in the semiconductor light-emitting device 110 according to this embodiment, the stacked body 30 is interposed between the light-emitting portion 40 and the n-type semiconductor layer 20. The average In composition ratio p of the stacked body 30 is made higher than 0.4 times the light-emitting portion average In composition ratio q of the light-emitting portion 40. This relaxes the aforementioned strain. Thus, even in the case where the thickness of the barrier layer 41 is thinned to decrease the driving voltage, high light emission efficiency can be achieved.

If the average In composition ratio p of the stacked body is equal to or lower than 0.4 times the average In composition ratio q of the light-emitting portion 40, the effect of relaxing the aforementioned strain may not be sufficiently achieved.

Here, if the average In composition ratio p of the stacked body 30 is equal to the light-emitting portion average In composition ratio q of the light-emitting portion 40, light emitted from the light-emitting portion 40 toward the n-type semiconductor layer 20 is absorbed in the first layer 31 and the second layer 32 of the stacked body 30. Hence, in this embodiment, the average In composition ratio p is made lower than the average In composition ratio q. This can suppress the aforementioned absorption and increase the light emission efficiency.

In general, it is considered that the driving voltage can be decreased by thinning the layer thickness $t_b$ of the barrier layer 41. However, if the layer thickness $t_b$ of the barrier layer 41 is thinned, the crystallinity of the light-emitting portion 40 tends to be degraded. For instance, if the layer thickness $t_b$ of the barrier layer 41 is 10 nm or less, the light emission efficiency may be decreased due to the degraded crystallinity of the light-emitting portion 40.

As a consequence of experiments, the inventors have found the aforementioned condition for allowing increase in light emission efficiency while reducing the driving voltage by decreasing the layer thickness $t_b$ of the barrier layer 41 to 10 nm or less.

In the following, the experimental results which have served as a basis for finding the aforementioned condition are described.

In these experiments, the configuration of the light-emitting portion 40 (the thickness and In composition ratio of the barrier layer 41, and the thickness and In composition ratio of the well layer 42) and the configuration of the stacked body 30 (the thickness and In composition ratio of the first layer 31, and the thickness and In composition ratio of the second layer 32) were varied to fabricate semiconductor light-emitting devices. The driving voltage Vf and optical output power Po thereof were evaluated.

First Experiment

In the first experiment, samples of the semiconductor light-emitting device were fabricated as follows.

First, a C-surface sapphire substrate 10, for instance, was subjected to organic cleaning and acid cleaning. The substrate 10 was introduced into the reaction furnace of an MOCVD apparatus. On a susceptor of the reaction furnace, the substrate 10 was heated to approximately 1100° C. Thus, oxide film on the surface of the substrate 10 is removed.

Next, on the major surface (C-surface) of the substrate 10, a buffer layer 11 was grown to a thickness of 30 nm. Furthermore, on the buffer layer 11, an undoped GaN foundation layer 21 was grown to a thickness of 3 micrometers (μm).

Furthermore, on the GaN foundation layer 21, an n-type GaN contact layer 22 made of Si-doped GaN was grown to a thickness of 2 μm.

Next, on the n-type GaN contact layer 22, first layers 31 made of $In_xGa_{1-x}N$ and second layers 32 made of $In_yGa_{1-y}N$ were alternately stacked 30 periods to form a stacked body 30.

Here, the In composition ratio x of the first layer 31 was zero, and its thickness was 1 nm. The In composition ratio y of the second layer 32 was 0.08, and its thickness was 2.5 nm.

Next, on the stacked body 30, barrier layers 41 and well layers 42 were alternately stacked 8 periods.

In this experiment, the In composition ratio b of the barrier layer 41 was zero, and the In composition ratio w of the well layer 42 was 0.15.

The layer thickness of the barrier layer 41 was varied among three values: 5 nm, 10 nm, and 20 nm. On the other hand, the thickness of the well layer 42 was fixed to 2.5 nm. These samples are designated as sample x1, sample x2, and sample x3. That is, the thickness of the barrier layer 41 in the samples x1, x2, and x3 is 5 nm, 10 nm, and 20 nm, respectively.

On the last well layer 42, in all the samples x1, x2, and x3, a barrier layer 41 made of GaN with a layer thickness of 5 nm was grown as the last barrier layer 41.

Furthermore, on this barrier layer 41, an AlGaN layer with an Al composition ratio of 0.003 and a layer thickness of 5 nm was grown. Subsequently, a Mg-doped AlGaN layer 51 with an Al composition ratio of 0.1 and a layer thickness of 5 nm, a Mg-doped p-type GaN layer 52 with a layer thickness of 80 nm (Mg concentration $2 \times 10^{19}/cm^3$), and a highly Mg-doped GaN layer 53 with a layer thickness of approximately 10 nm (Mg concentration $1 \times 10^{21}/cm^3$) were stacked. Subsequently, the substrate 10 with the aforementioned crystals grown thereon was taken out of the reaction furnace of the MOCVD apparatus.

Next, part of the above multilayer film structure was dry etched halfway through the n-type GaN contact layer 22. Thus, the n-type GaN contact layer 22 was exposed. An n-side electrode 70 made of Ti/Pt/Au was formed thereon. Furthermore, a transparent electrode 60 made of ITO (indium tin oxide) was formed on the surface of the highly Mg-doped GaN layer 53. A p-side electrode 80 made of Ni/Au with a diameter of 80 μm, for instance, was formed on part of the transparent electrode 60.

Thus, the samples x1-x3 were fabricated. The semiconductor light-emitting devices of the samples x1-x3 thus fabricated are blue LEDs emitting at a main wavelength of 450 nm.

Figure 3:
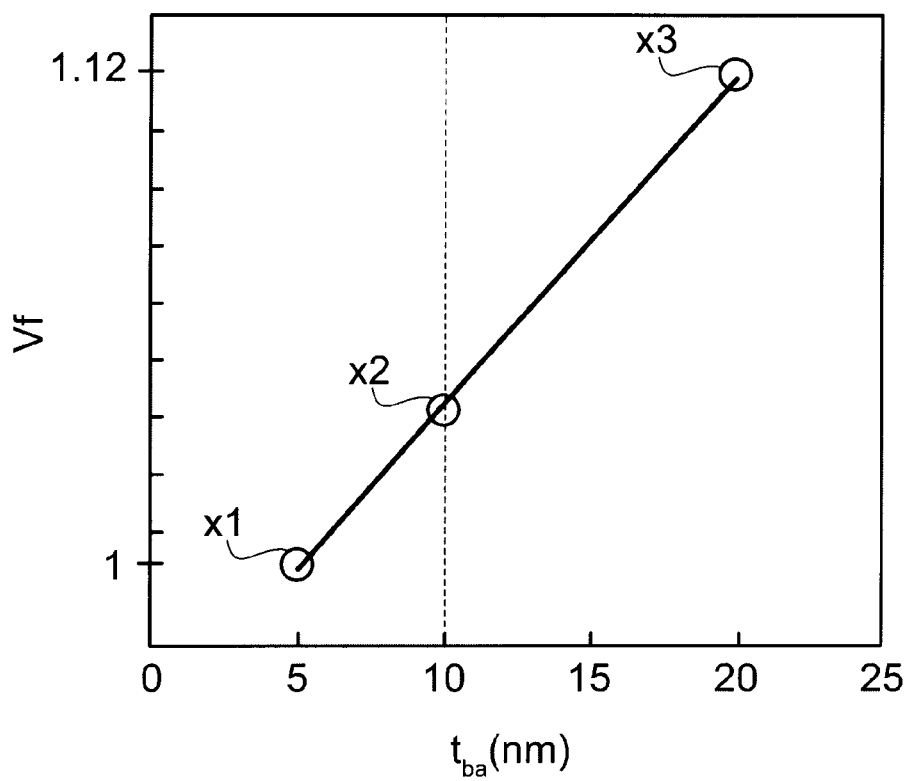
FIGS. 3 to 8 are graphs illustrating an experimental result related to the semiconductor light-emitting devices.

FIG. 3 is a graph illustrating an experimental result related to the semiconductor light-emitting devices.

More specifically, FIG. 3 illustrates the variation of driving voltage Vf for the samples x1-x3 with the layer thickness of the barrier layer 41 varied. In FIG. 3, the horizontal axis represents the layer thickness $t_b$ (nm) of the barrier layer 41. The vertical axis represents the driving voltage Vf of the semiconductor light-emitting device. Here, the driving voltage Vf is expressed as a relative value, where the driving voltage is 1 when the layer thickness $t_b$ of the barrier layer 41 is 10 nm.

As shown in FIG. 3, the driving voltage Vf of the semiconductor light-emitting device decreases with the decrease of the layer thickness $t_b$ (nm) of the barrier layer 41.

From the viewpoint of the driving voltage Vf with practical suitability, the layer thickness $t_b$ of the barrier layer 41 is preferably 10 nm or less. More preferably, the layer thickness $t_b$ of the barrier layer 41 is 5 nm or less.

Second Experiment

In the second experiment, the ratio p/q, i.e., the ratio of the average In composition ratio p of the stacked body 30 to the average In composition ratio q of the light-emitting portion 40, was varied.

Specifically, as in the first experiment, the In composition ratio b of the barrier layer 41 was zero. The In composition ratio w of the well layer 42 was 0.1. The layer thickness of the barrier layer 41 was 5 nm. The thickness of the well layer 42 was 2.5 nm.

As in the first experiment, the In composition ratio x of the first layer 31 of the stacked body 30 was zero, and its thickness was 1 nm. The number of stacked layers was 30 pairs. The thickness of the second layer 32 was 2.5 nm. The In composition ratio y of the second layer 32 was varied as 0.04 and 0.08. Furthermore, a sample without the stacked body 30 was fabricated. The sample without the stacked body was designated as sample y1. The sample with the In composition ratio y of the second layer 32 being 0.04 was designated as sample y2. The sample with the In composition ratio y of the second layer 32 being 0.08 was designated as sample y3.

In the sample y1, p/q is zero. In the sample y2, p/q is 0.25. In the sample y3, p/q is 0.5.

The samples y1, y2, and y3 are near ultraviolet LEDs emitting at a main wavelength of 400 nm.

Figure 4:
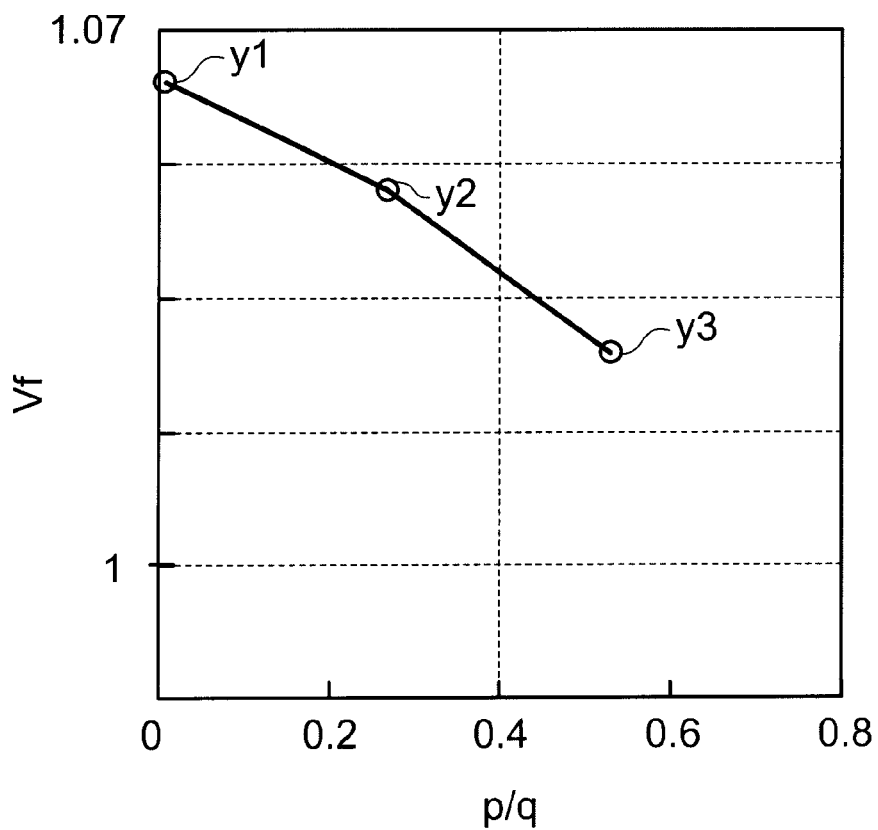
Figure 5:
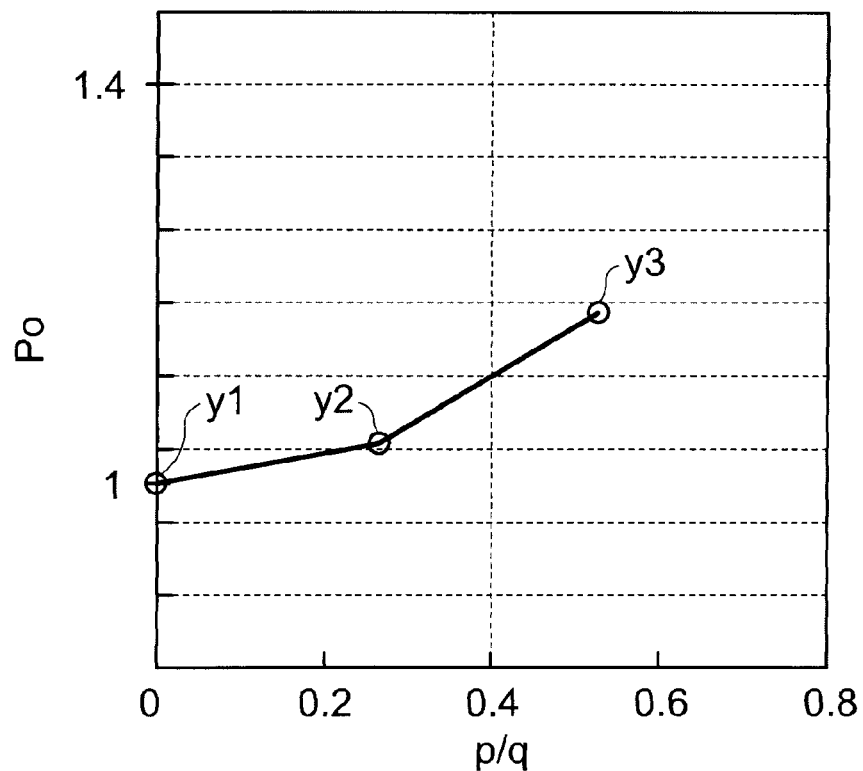

FIGS. 4 and 5 are graphs illustrating an experimental result related to the semiconductor light-emitting devices.

More specifically, FIG. 4 illustrates the variation of the driving voltage Vf of the semiconductor light-emitting device for the samples y1, y2, and y3. In FIG. 4, the horizontal axis represents p/q, and the vertical axis represents the driving voltage Vf of the semiconductor light-emitting device. Here, the vertical axis is expressed in relative value.

FIG. 5 illustrates the variation of the optical output power Po of the semiconductor light-emitting device for the samples y1, y2, and y3. In FIG. 5, the horizontal axis represents p/q, and the vertical axis represents the optical output power Po of the semiconductor light-emitting device in milliwatts (mW). Here, the vertical axis is expressed in relative value.

As shown in FIG. 4, the driving voltage Vf of the semiconductor light-emitting device decreases with the increase of p/q. More specifically, the decrease of driving voltage Vf is more significant for p/q over 0.4.

On the other hand, as shown in FIG. 5, the optical output power Po of the semiconductor light-emitting device increases with the increase of p/q. More specifically, the optical output power Po significantly increases for p/q over 0.4.

From FIGS. 4 and 5, in view of both the decrease of driving voltage Vf and the increase of optical output power Po, it is found that high p/q is preferable. From the practical viewpoint, p/q is preferably higher than 0.4.

Third Experiment

In the third experiment, the In composition ratio w of the well layer 42 was set to 0.15, and the ratio p/q, i.e., the ratio of the average In composition ratio p of the stacked body 30 to the average In composition ratio q of the light-emitting portion 40, was varied.

Specifically, the In composition ratio b of the barrier layer 41 was zero. The layer thickness of the barrier layer 41 was 5 nm. On the other hand, the In composition ratio w of the well layer 42 was 0.15. The thickness of the well layer 42 was 2.5 nm.

Furthermore, the In composition ratio x of the first layer 31 of the stacked body 30 was zero. The thickness of the second layer 32 was 2.5 nm.

Then, samples z with seven different values of p/q were fabricated by varying the In composition ratio y of the second layer 32 or the layer thickness $t_x$ of the first layer 31. Here, the thickness $S_{all}$ of the stacked body 30 was adjusted to remain substantially constant (approximately 105 nm). The samples z are blue LEDs emitting at a main wavelength of 450 nm.

Figure 6:
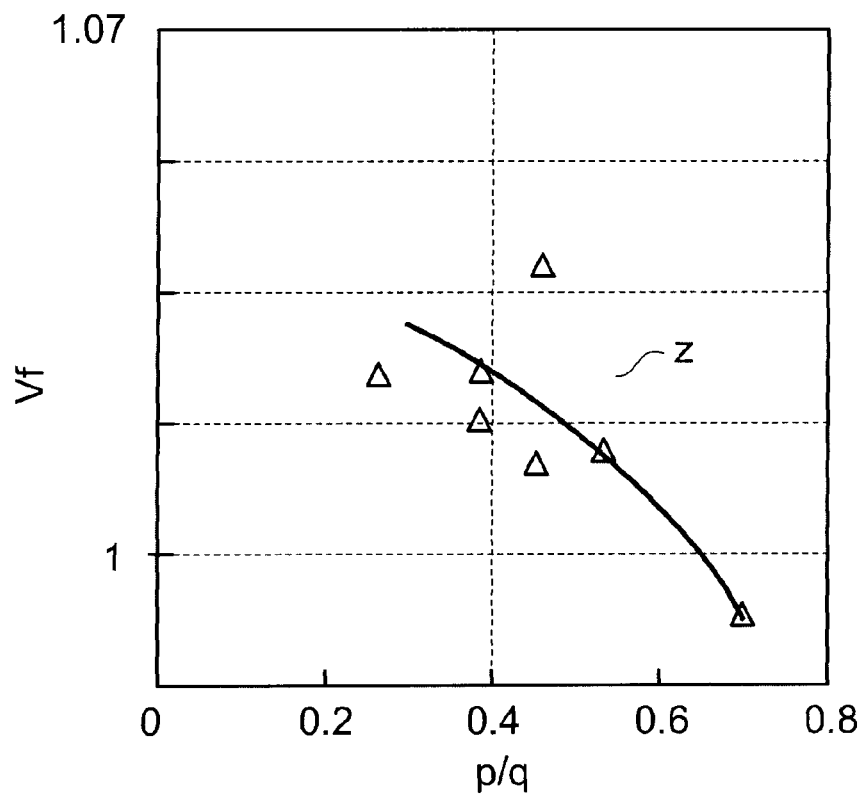
Figure 7:
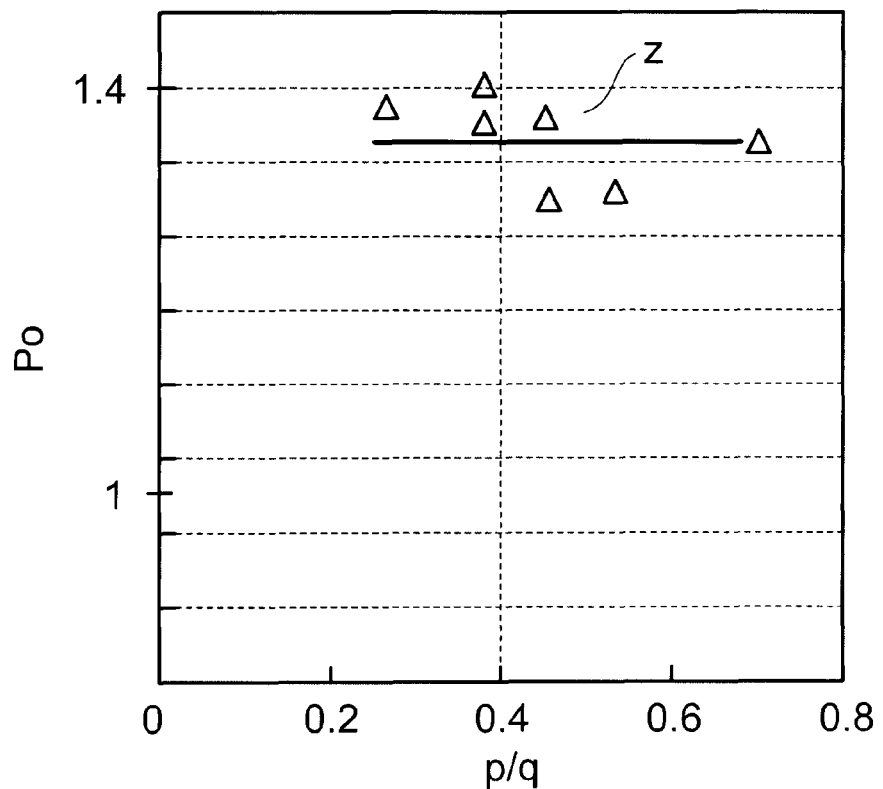

FIGS. 6 and 7 are graphs illustrating an experimental result related to the semiconductor light-emitting devices.

FIG. 6 illustrates the variation of the driving voltage Vf of the semiconductor light-emitting device for the samples z. In FIG. 6 the horizontal axis represents p/q, and the vertical axis represents the driving voltage Vf of the semiconductor light-emitting device. Here, the vertical axis is expressed in relative value.

FIG. 7 illustrates the variation of the optical output power Po of the semiconductor light-emitting device for the samples z. In this figure, the horizontal axis represents p/q, and the vertical axis represents the optical output power Po of the semiconductor light-emitting device in milliwatts (mW). Here, the vertical axis is expressed in relative value.

As shown in FIG. 6, also for near ultraviolet LEDs, the driving voltage Vf of the semiconductor light-emitting device decreases with the increase of p/q over 0.4.

On the other hand, as shown in FIG. 7, for the samples z, large optical output power Po is generally maintained despite the variation of p/q. That is, good optical output is obtained for p/q higher than 0.4.

As described above, for small layer thickness $t_b$ of the barrier layer 41, the driving voltage Vf decreases. From the practical viewpoint, the layer thickness $t_b$ of the barrier layer 41 is preferably 10 nm or less. Furthermore, for high p/q, the driving voltage Vf decreases, and the optical output power Po increases. In particular, for p/q higher than 0.4, the decrease of driving voltage Vf and the increase of optical output power Po are significant.

In a semiconductor light-emitting device based on nitride semiconductors, the well layer 42 (quantum well layer) is made of InGaN. In such a semiconductor light-emitting device, the well layer 42 including InGaN has a large lattice constant difference from the substrate used for crystal growth and various semiconductor layers stacked thereon (such as the GaN layer). Thus, lattice strain is likely to occur in the well layer 42. Furthermore, the strain is augmented also between the well layer 42 and the barrier layer 41 because of the uniform In composition ratio. If the well layers 42 and the barrier layers 41 are stacked in a large number, this strain is accumulated to a large extent. Thus, the lattice strain applied to the well layer 42 also increases.

An excessive lattice strain applied to the well layer 42 is likely to cause defects due to lattice relaxation. Furthermore, if strain in the c-axis direction occurs in a hexagonal nitride semiconductor grown along the c-axis, the piezoelectric field modulates the band structure of the active layer and leads to decreasing the light emission efficiency.

On the other hand, in the case where the thickness of the barrier layer 41 is thinned to decrease the driving voltage, the crystallinity is degraded. Simultaneously, the aforementioned strain applied to the well layer 42 increases. This tends to further interfere with the increase of light emission efficiency.

In contrast, from the results of the above first to third experiment, although the thickness of the barrier layer 41 is 10 nm or less, such as 5 nm, if p/q is set higher than 0.4, then the optical output power Po can be increased while decreasing the driving voltage Vf.

More specifically, the stacked body 30 is interposed between the light-emitting portion 40 and the n-type semiconductor layer 20. The stacked body average In composition ratio p of the stacked body 30 is made higher than 0.4 times the light-emitting portion average In composition ratio q of the light-emitting portion 40. This relaxes the strain applied to the light-emitting portion 40, and can sufficiently improve the crystallinity. Thus, even in the case where the layer thickness of the barrier layer 41 is thinned, the sufficient crystallinity of the light-emitting portion 40 makes it possible to achieve the decrease of driving voltage while increasing the light emission efficiency.

It should be noted that no one has ever paid attention to the average In composition ratios of the light-emitting portion 40 and the stacked body 30. In the process of analyzing the above experimental results, the ratio (p/q) of the average In composition ratios of the light-emitting portion 40 and the stacked body 30 has been noticed. This leads to the discovery of the technique which can simultaneously achieve the decrease of driving voltage Vf and the increase of optical output power Po.

Typically, in the stacked body 30 including nitride semiconductors, for instance, the first layer 31 has an In composition ratio x of 0.03 and a layer thickness $t_x$ of 2.5 nm. The second layer 32 has an In composition ratio y of zero and a layer thickness $t_y$ of 2.5 nm. The thickness $S_{all}$ of the stacked body 30 is e.g. 50 nm. In the light-emitting portion 40, for instance, the barrier layer 41 has an In composition ratio b of zero and a layer thickness $t_b$ of 20 nm. The well layer 42 has an In composition ratio w of 0.4 and a layer thickness $t_w$ of 3 nm. The thickness $T_{all}$ of the light-emitting portion 40 is e.g. 112 nm.

In this case, p/q is 0.34. In this case, as described with reference to FIGS. 4 to 7, the effect of decreasing the driving voltage Vf and increasing the optical output power Po is lower than for p/q higher than 0.4. Under this condition, $S_{all}/T_{all}$ is 0.45.

Fourth Experiment

In the fourth experiment, the In composition ratio w of the well layer 42 was set to 0.15, and the ratio of the thickness $S_{all}$ of the stacked body 30 to the thickness $T_{all}$ of the light-emitting portion 40 was varied.

Specifically, the In composition ratio b of the barrier layer 41 was zero. The layer thickness of the barrier layer 41 was 10 nm. On the other hand, the In composition ratio w of the well layer 42 was 0.15. The thickness of the well layer 42 was 2.5 nm.

Furthermore, the In composition ratio x of the first layer 31 of the stacked body 30 was zero, and its thickness was 1 nm. The In composition ratio y of the second layer 32 was 0.08, and its thickness was 2.5 nm.

Then, by fixing the number of stacked well layers 42 and varying the number of stacked layers in the stacked body 30, samples x11, x12, and x13 were fabricated with three different values of the ratio ($R=S_{all}/T_{all}$) of the thickness $S_{all}$ of the stacked body 30 to the thickness $T_{all}$ of the light-emitting portion 40. The samples x11, x12, and x13 are blue LEDs emitting at a main wavelength of 450 nm.

More specifically, the sample x11 has a layer thickness ratio $S_{all}/T_{all}$ of 0.7. The sample x12 has a layer thickness ratio $S_{all}/T_{all}$ of 1.1. The sample x13 has a layer thickness ratio $S_{all}/T_{all}$ of 1.5.

Figure 8:
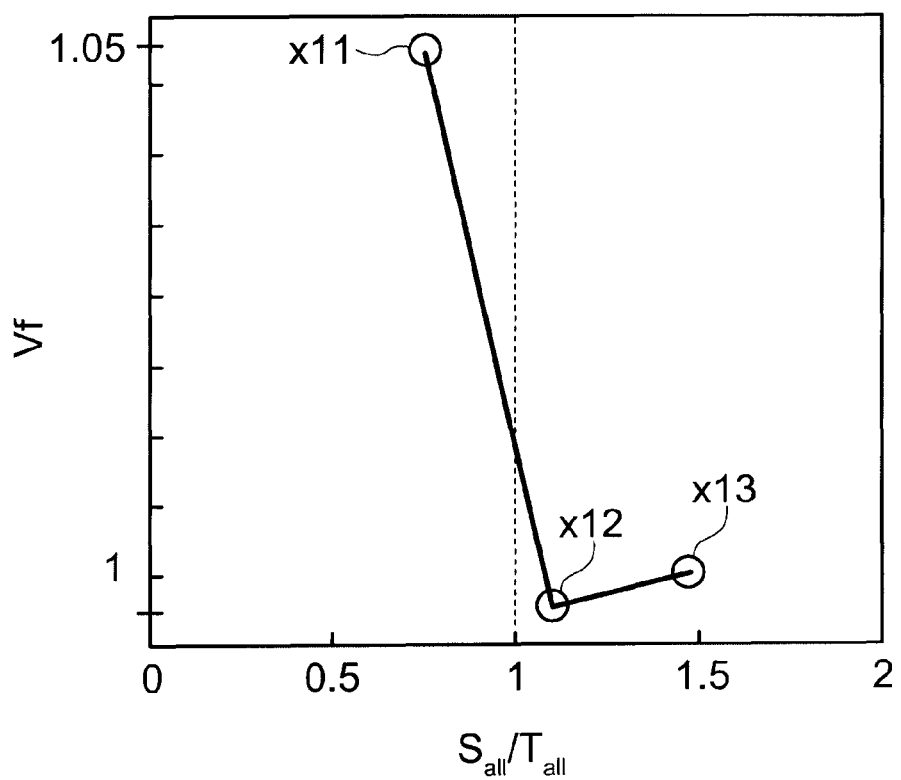

FIG. 8 is a graph illustrating an experimental result related to the semiconductor light-emitting devices.

FIG. 8 illustrates the variation of the driving voltage Vf of the semiconductor light-emitting device for the samples x11, x12, and x13. In this figure, the horizontal axis represents $S_{all}$ (nm)/$T_{all}$ (nm), and the vertical axis represents the driving voltage Vf of the semiconductor light-emitting device. Here, the vertical axis represents a relative value, where the driving voltage Vf is 1 when $S_{all}/T_{all}$ is 1.1.

As shown in FIG. 8, when the layer thickness ratio $S_{all}/T_{all}$ is 1 or more, i.e., when the thickness $S_{all}$ of the stacked body 30 is equal to or greater than the thickness $T_{all}$ of the light-emitting portion 40, the driving voltage Vf of the semiconductor light-emitting device sharply decreases.

PRACTICAL EXAMPLE

The semiconductor light-emitting device according to a practical example has the configuration of the semiconductor light-emitting device 110 illustrated in FIGS. 1 and 2.

The In composition ratio b of the barrier layer 41 was zero. The layer thickness of the barrier layer 41 was 5 nm. On the other hand, the In composition ratio w of the well layer 42 was 0.1. The layer thickness of the well layer 42 was 2.5 nm.

The In composition ratio x of the first layer 31 of the stacked body 30 was zero, and its thickness was 1 nm. The In composition ratio y of the second layer 32 was 0.08, and its thickness was 2.5 nm.

The number of stacked well layers 42 is eight pairs (the number of well layers 42 is eight, and the number of barrier layers 41 is eight). The number of layers in the stacked body 30 is 30 (the number of first layers 31 is 30, and the number of second layers 32 is 30).

In the semiconductor light-emitting device of this practical example, the average In composition ratio q of the light-emitting portion 40 is q=0.032. The average In composition ratio p of the stacked body 30 is p=0.02. Hence, p/q is 0.63. The thickness $T_{all}$ of the light-emitting portion 40 is $T_{all}$=60 nm (except the thickness of the last barrier layer 41). The overall thickness $S_{all}$ of the stacked body 30 is $S_{all}$=100 nm. Hence, $S_{all}/T_{all}$ is 1.6. This semiconductor light-emitting device was measured by a total luminous flux measurement system. Then, the light emission wavelength was 407 nm, the driving voltage was 3.2 volts (V), and the optical output power was 17 mW. The wall plug efficiency was 26%.

COMPARATIVE EXAMPLE

The semiconductor light-emitting device of a comparative example was the same as that of the above practical example except that the In composition ratio y of the second layer 32 of the stacked body 30 was 0.04. In the semiconductor light-emitting device of the comparative example, p/q is 0.32. Furthermore, $S_{all}/T_{all}$ is 1.6. In the semiconductor light-emitting device of the comparative example, the driving voltage was 3.3 V, and the optical output power was 14 mW. The wall plug efficiency was 21%.

Thus, by setting p/q higher than 0.4, the decrease of driving voltage Vf and the increase of optical output power can be simultaneously achieved.

In the following, an example configuration of the semiconductor light-emitting device 110 is described.

In the light-emitting portion 40, for instance, well layers 42 with a layer thickness $t_w$ (nm) and barrier layers 41 with a layer thickness $t_b$ (nm) are alternately stacked.

The thickness of the barrier layer 41 is e.g. 5 nm or more and 10 nm or less. The thickness of the well layer 42 is e.g. 2 nm or more and 3 nm or less. Such barrier layers 41 and well layers 42 are stacked in a repeating structure of 6-8 periods. The barrier layer 41 is made of e.g. GaN. For blue LEDs emitting at a wavelength of 450 nm, the well layer 42 is made of InGaN with an In composition ratio w of approximately 0.15. For near ultraviolet LEDs emitting at a wavelength of 400 nm, the well layer 42 is made of InGaN with an In composition ratio w of approximately 0.1.

The thickness $T_{all}$ of the light-emitting portion 40 having such a structure (except the last barrier layer 41) is e.g. 50 nm or more and 110 nm or less. For blue LEDs, the light-emitting portion average In composition ratio q of the light-emitting portion 40 is set to approximately 0.035 or more and 0.056 or less. For near ultraviolet LEDs, the light-emitting portion average In composition ratio q of the light-emitting portion 40 is set to approximately 0.023 or more and 0.038 or less. This provides the desired wavelength of emission light, the desired low driving voltage, and high light emission efficiency.

In the stacked body 30, for instance, first layers 31 with a layer thickness $t_x$ (nm) and second layers 32 with a layer thickness $t_y$ (nm) are alternately stacked.

As described above, in the semiconductor light-emitting device according to this embodiment, the stacked body average In composition ratio p of the stacked body 30 is set higher than 0.4 times the light-emitting portion average In composition ratio q of the light-emitting portion 40.

Furthermore, the thickness $S_{all}$ (nm) of the stacked body 30 is made equal to or greater than the thickness $T_{all}$ (nm) of the light-emitting portion 40.

As described above, for blue LEDs, the light-emitting portion average In composition ratio q is e.g. 0.035 or more and 0.056 or less. The stacked body average In composition ratio p is set higher than 0.4 times this value of the light-emitting portion average In composition ratio q.

For near ultraviolet LEDs, the light-emitting portion average In composition ratio q is e.g. approximately 0.023 or more and 0.038 or less. The stacked body average In composition ratio p is set higher than 0.4 times this value of the light-emitting portion average In composition ratio q.

From the viewpoint of crystallinity, the In composition ratio x of the first layer 31 ($In_xGa_{1-x}N$) included in the stacked body 30 is preferably in the range of zero or more and less than 0.2. More preferably, for instance, the In composition ratio x is zero.

The In composition ratio y of the second layer 32 ($In_yGa_{1-y}N$) is preferably in the range of greater than zero and less than 0.2 (where y is greater than x). More preferably, for instance, the In composition ratio y is in the range of 0.08 or more and less than 0.15.

The layer thickness $t_x$ of the first layer 31 is preferably thicker than 1 nm. More preferably, for instance, the layer thickness $t_x$ is in the range of thicker than 1 nm and thinner than 3 nm.

The layer thickness $t_y$ of the second layer 32 is preferably thicker than 0 nm and thinner than 2 nm. More preferably, for instance, the layer thickness $t_y$ is in the range of 1 nm or more and 1.5 nm or less.

The inventor has confirmed that setting the number of pairs of the first layer 31 and the second layer 32 to 30 pairs or more is effective for high optical output power and low driving voltage in the semiconductor light-emitting device. Here, setting the number of pairs to 30 pairs or more is consistent with the thickness $S_{all}$ (nm) of the stacked body 30 being equal to or greater than the thickness $T_{all}$ (nm) of the light-emitting portion 40.

In the semiconductor light-emitting device including the stacked body 30 and the light-emitting portion 40 as described above, the lattice strain applied to the light-emitting portion 40 can be sufficiently reduced. Thus, the semiconductor light-emitting device achieves compatibility between high light emission efficiency and low driving voltage.

Furthermore, in this embodiment, the thickness $S_{all}$ (nm) of the stacked body 30 is equal to or greater than the thickness $T_{all}$ (nm) of the light-emitting portion 40.

Thus, the distortion stress applied to the light-emitting portion 40 can be sufficiently relaxed by the stacked body 30. Hence, the increase of light emission efficiency and the decrease of driving voltage are achieved.

In the above example, the light-emitting portion 40 has an MQW configuration with barrier layers 41 and well layers 42 alternately repeated therein. However, the light-emitting portion 40 may have an SQW (single quantum well) configuration with a well layer 42 sandwiched between a pair of barrier layers 41.

In the stacked body 30 with a plurality of first layers 31 and a plurality of second layers 32 alternately stacked therein, the average In composition ratio p may be determined either from any one pair of the first layer 31 and the second layer 32, or from all the first layers 31 and the second layers 32.

In the light-emitting portion 40 with well layers 42 provided between a plurality of barrier layers 41, the average In composition ratio q may be determined either from any one pair of the barrier layer 41 and the well layer 42, or from all the barrier layers 41 and the well layers 42.

In the semiconductor light-emitting device according to this embodiment, it is only necessary that the average In composition ratio p determined from one of the foregoing be higher than 0.4 times the average In composition ratio q determined from one of the foregoing.

Here, suppose that the stacked body 30 includes M (M being an integer of 2 or more) first layers 31 and M second layers 32. In this case, as viewed from the n-type semiconductor layer 20, the j-th (j being an integer of 1 or more and M or less) first layer 31 is denoted by "first layer $31_j$". Furthermore, as viewed from the n-type semiconductor layer 20, the j-th second layer 32 is denoted by "second layer $32_j$". It is assumed that the first layer $31_j$ is adjacent to the second layer $32_j$ on the n-type semiconductor layer 20 side of the second layer $32_j$.

In this notation, the first layer 31, includes $In_{xj}Ga_{1-xj}N$ ($0 \leq xj < 1$) and has a layer thickness $t_{xj}$. The second layer $32_j$ includes $In_{yj}Ga_{1-yj}N$ ($0 < yj \leq 1$) and has a layer thickness $t_{yj}$.

Here, the average In composition ratio p of the stacked body 30 can be determined from the first layer 31; and the second layer 32; for arbitrary j.

More specifically, the average In composition ratio p of the stacked body 30 in this case is determined as $(xj \times t_{xj} + yj \times t_{yj})/(t_{xj} + t_{yj})$. The average In composition ratio p thus determined is designated as p(j).

Furthermore, the average In composition ratio p of the stacked body 30 can be determined from the M first layers $31_1$-$31_M$ and second layers $32_1$-$32_M$.

More specifically, the average In composition ratio p of the stacked body 30 in this case is determined as $\Sigma(xj \times t_{xj} + yj \times t_{yj})/\Sigma(t_{xj} + t_{yj})$. Here, $\Sigma$ represents summation for j=1, ..., M. The average In composition ratio p thus determined is designated as $p(\Sigma)$.

On the other hand, suppose that the light-emitting portion 40 includes N (N being an integer of 2 or more) barrier layers 41 and N well layers 42. In this case, as viewed from the n-type semiconductor layer 20, the i-th (i being an integer of 1 or more and N or less) barrier layer 41 is denoted by "barrier layer $41_i$". Furthermore, as viewed from the n-type semiconductor layer 20, the i-th well layer 42 is denoted by "well layer $42_i$". It is assumed that the barrier layer $41_i$ is adjacent to the well layer $42_i$ on the n-type semiconductor layer 20 side of the well layer $42_i$. Here, the last barrier layer 41, i.e., barrier layer $41_{N+1}$, is provided between the p-type semiconductor layer 50 and the well layer $42_N$ nearest to the p-type semiconductor layer 50.

In this notation, the barrier layer 41, includes $In_{bi}Ga_{1-bi}N$ ($0 \leq bi < 1$) and has a layer thickness $t_{bi}$. The well layer $42_i$ includes $In_{wi}Ga_{1-wi}N$ ($0 < wi < 1$) and has a layer thickness $t_{wi}$.

Here, the average In composition ratio q of the light-emitting portion 40 can be determined from the barrier layer $41_i$ and the well layer $42_i$ for arbitrary i.

More specifically, the average In composition ratio q of the light-emitting portion 40 in this case is determined as $(wi \times t_{wi} + bi \times t_{bi})/(t_{wi} + t_{bi})$. The average In composition ratio q thus determined is designated as q(i).

Furthermore, the average In composition ratio q of the light-emitting portion 40 can be determined from the N barrier layers $41_1$-$41_N$ and well layers $42_1$-$42_N$.

More specifically, the average In composition ratio q of the light-emitting portion 40 in this case is determined as $\Sigma(wi \times t_{wi} + bi \times t_{bi})/\Sigma(t_{wi} + t_{bi})$. Here, Z represents summation for i=1, ..., N. The average In composition ratio q thus determined is designated as $q(\Sigma)$.

In the semiconductor light-emitting device according to this embodiment, it is only necessary that one of the average In composition ratios p(i) and $p(\Sigma)$ be higher than 0.4 times one of the average In composition ratios q(i) and $q(\Sigma)$.

Second Embodiment

The second embodiment relates to a method for manufacturing a semiconductor light-emitting device.

Figure 9:
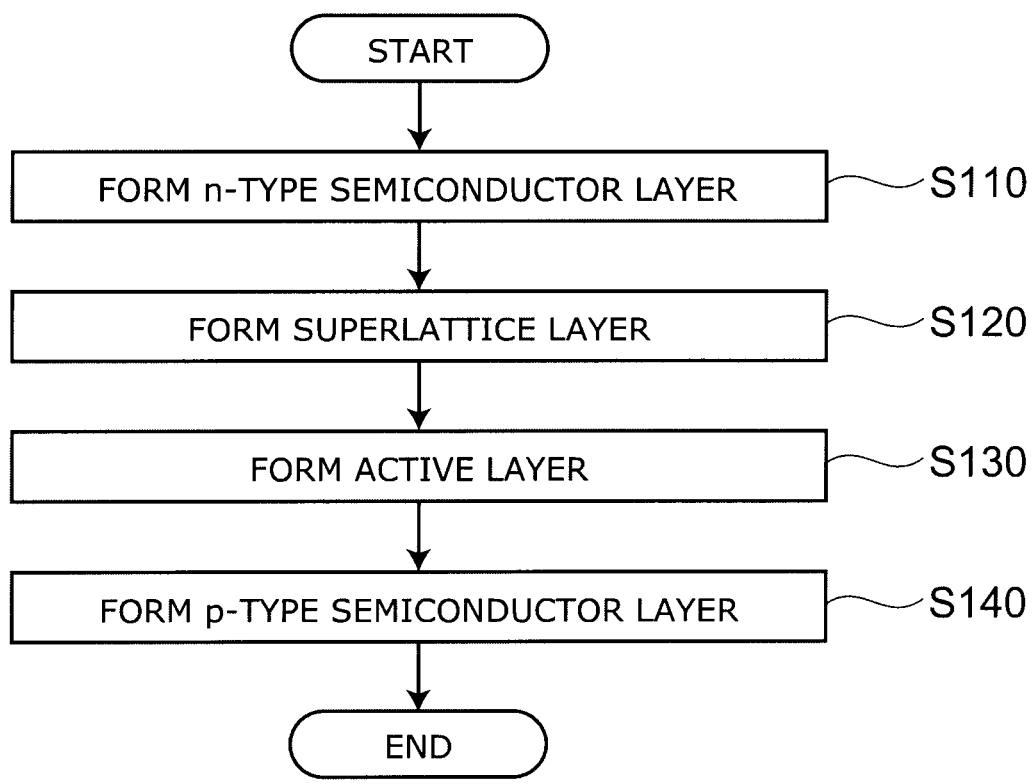
FIG. 9 is a flow chart illustrating a method for manufacturing a semiconductor light-emitting device.

FIG. 9 is a flow chart illustrating a method for manufacturing a semiconductor light-emitting device according to the second embodiment.

As shown in FIG. 9, this manufacturing method includes the following forming steps.

This manufacturing method comprises the step of forming an n-type semiconductor layer 20 including a nitride semiconductor on a substrate 10 (step S110), the step of forming a stacked body 30 including a first layer 31 and a second layer 32 on the n-type semiconductor layer 20 (step S120), the step of forming a light-emitting portion 40 including a barrier layer 41 and a well layer 42 on the stacked body 30 (step S130), and the step of forming a p-type semiconductor layer 50 on the light-emitting portion 40 (step S140).

The step of forming the stacked body 30 includes the step of forming the first layer 31 including $In_xGa_{1-x}N$ ($0 \leq x < 1$) with a thickness of layer thickness $t_x$ nanometers on the n-type semiconductor layer 20, and the step of forming the second layer 32 including $In_yGa_{1-y}N$ ($0 < y < 1$, $x < y$) with a thickness of layer thickness $t_y$ nanometers on the first layer 31.

The step of forming the light-emitting portion 40 includes the step of forming the barrier layer 41 including $In_bGa_{1-b}N$ ($0 \leq b < 1$, $b < w$) with a layer thickness $t_b$ nanometers having a value of 10 nanometers or less on the stacked body 30, and the step of forming the well layer 42 including $In_wGa_{1-w}N$ ($0 < w < 1$, $y < w$) with a thickness of layer thickness $t_w$ nanometers on the barrier layer 41.

At least one of the step of forming the stacked body 30 and the step of forming the light-emitting portion 40 is performed so that the average In composition ratio of the stacked body 30 is higher than 0.4 times the average In composition ratio of the light-emitting portion 40, where the average In composition ratio of the stacked body 30 (stacked body average In composition ratio p) is $(x \times t_x + y \times t_y)/(t_x + t_y)$, and the average In composition ratio of the light-emitting portion 40 (light-emitting portion average In composition ratio q) is $(w \times t_w + b \times t_b)/(t_w + t_b)$.

This makes it possible to manufacture a semiconductor light-emitting device with increased light emission efficiency and reduced driving voltage. Furthermore, high wall plug efficiency can be achieved.

In the foregoing description, the film formation process is illustratively based on MOCVD (metal organic chemical vapor deposition). However, other methods are also applicable, such as molecular beam epitaxy (MBE) and halide vapor phase epitaxy (HVPE).

The "nitride semiconductor" referred to herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, the "nitride semiconductor" also includes those represented by the above chemical formula and further containing any group V element other than N (nitrogen), further containing any of various elements added for controlling various material properties such as conductivity type, and further containing any of various unintended elements.

The embodiments of the invention have been described with reference to examples. However, the invention is not limited to these examples. For instance, various specific configurations of the components such as the n-type semiconductor layer, p-type semiconductor layer, active layer, well layer, barrier layer, electrode, substrate, and buffer layer included in the semiconductor light-emitting device can be variously modified in shape, size, material, and layout by those skilled in the art. Such modifications are also encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the semiconductor light-emitting device described above in the embodiments of the invention. All the semiconductor light-emitting devices thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light-emitting device comprising:
    a substrate having a C-surface;
    an n-type semiconductor layer provided on the C-surface and including a nitride semiconductor;
    a p-type semiconductor layer including a nitride semiconductor;
    a light-emitting portion provided between the n-type semiconductor layer and the p-type semiconductor layer and including:
        a barrier layer including $In_bGa_{1-b}N$ ($0 \leq b < 1$) and having a layer thickness $t_b$ (nanometers); and
        a well layer stacked with the barrier layer, including $In_wGa_{1-w}N$ ($0 < w < 1$, $b < w$), and having a layer thickness $t_W$ (nanometers); and
    a stacked body provided between the light-emitting portion and the n-type semiconductor layer and including:
        a first layer including $In_xGa_{1-x}N$ ($0 \leq x < 1$) and having a layer thickness $t_x$ (nanometers); and
        a second layer stacked with the first layer, including $In_yGa_{1-y}N$ ($0 < y < 1$, $x < y < w$), and having a layer thickness $t_y$ (nanometers),
    an average In composition ratio of the stacked body being higher than 0.4 times and not higher than 0.7 times an average In composition ratio of the light-emitting portion, assuming that the average In composition ratio of the light-emitting portion is $(w \times t_w + b \times t_b)/(t_w + t_b)$, and the average In composition ratio of the stacked body is $(x \times t_x + y \times t_y)/(t_x + t_y)$, and
    the layer thickness $t_b$ of the barrier layer being 10 nanometers or less,
    a thickness of the stacked body being equal to or greater than a thickness of the light-emitting portion,
    a thickness of the first layer being thicker than 1 nanometer and thinner than 3 nanometers,
    a thickness of the second layer being thicker than 0 nanometer and thinner than 2 nanometers.

2. The device according to claim 1, wherein
    the first layer is provided in a plurality,
    the second layer is provided in a plurality, and
    the plurality of first layers and the plurality of second layers are alternately stacked.

3. The device according to claim 1, wherein
    the barrier layer is provided in a plurality, and the plurality of barrier layers are stacked with each other, and
    the well layer is provided in a plurality, and each of the plurality of well layers is located between the plurality of barrier layers.

4. The device according to claim 1, wherein the barrier layer containing In has an In composition ratio lower than an In composition ratio of the well layer.

5. The device according to claim 1, wherein the second layer has an In composition ratio higher than an In composition ratio of the first layer.

6. The device according to claim 1, wherein the second layer has an In composition ratio lower than an In composition ratio of the well layer.

7. The device according to claim 1, wherein the first layer has an In composition ratio lower than an In composition ratio of the well layer.

8. The device according to claim 1, wherein
    the first layer is provided in a plurality,
    the second layer is provided in a plurality, and
    the plurality of first layers and the plurality of second layers are alternately stacked.

9. The device according to claim 1, wherein
    the barrier layer is provided in a plurality, and the plurality of barrier layers are stacked with each other, and
    the well layer is provided in a plurality, and each of the plurality of well layers is located between the plurality of barrier layers.

10. The device according to claim 1, wherein the n-type semiconductor layer grows along the c-axis.

11. The device according to claim 1, wherein the thickness $t_b$ of the barrier layer is 5 nanometers or less.

12. A method for manufacturing a semiconductor light-emitting device, comprising:

forming an n-type semiconductor layer including a nitride semiconductor on a C-surface of a substrate;

forming a stacked body including a first layer and a second layer on the n-type semiconductor layer;

forming a light-emitting portion including a barrier layer and a well layer on the stacked body; and forming a p-type semiconductor layer on the light-emitting portion, the forming the stacked body including:

forming the first layer including $In_xGa_{1-x}N$ ($0 \leq x < 1$) with a thickness of layer thickness $t_x$ nanometers on the n-type semiconductor layer; and forming the second layer including $In_yGa_{1-y}N$ ($0 \leq y < 1$, $x < y$) with a thickness of layer thickness $t_y$ nanometers on the first layer, the forming the light-emitting portion including:

forming the barrier layer including $In_bGa_{1-b}N$ ($0 \leq b < 1$, $b < w$) with a layer thickness $t_b$ nanometers having a value of 10 nanometers or less on the stacked body; and forming the well layer including $In_wGa_{1-w}N$ ($0 < w < 1$, $y < w$) with a thickness of layer thickness $t_w$ nanometers on the barrier layer, at least one of the forming the stacked body and the forming the light-emitting portion being performed so that an average In composition ratio of the stacked body is higher than 0.4 times and not higher than 0.7 times an average In composition ratio of the light-emitting portion, a thickness of the stacked body being equal to or greater than a thickness of the light-emitting portion, a thickness of the first layer being thicker than 1 nanometer and thinner than 3 nanometers, and a thickness of the second layer being thicker than 0 nanometer and thinner than 2 nanometers, assuming that the average In composition ratio of the stacked body is $(x \times t_x + y \times t_y)/(t_x + t_y)$, and the average In composition ratio of the light-emitting portion is $(w \times t_x + b \times t_b)/(t_w + t_b)$.

13. The method according to claim 12, wherein
the first layer is provided in a plurality,
the second layer is provided in a plurality, and
the plurality of first layers and the plurality of second layers are alternately stacked.

14. The method according to claim 12, wherein
the barrier layer is provided in a plurality, and the plurality of barrier layers are stacked with each other, and
the well layer is provided in a plurality, and each of the plurality of well layers is located between the plurality of barrier layers.

* * * * *